(12) United States Patent
Teer et al.

(10) Patent No.: US 8,440,301 B2
(45) Date of Patent: May 14, 2013

(54) COATING APPARATUS AND METHOD

(75) Inventors: Dennis Teer, Droitwich (GB); Alex Goruppa, Droitwich (GB)

(73) Assignee: Teer Coatings Limited, Worcestershire (GB)

( * ) Notice: Subject to any disclaimer, the term of this patent is extended or adjusted under 35 U.S.C. 154(b) by 804 days.

(21) Appl. No.: 12/309,289

(22) PCT Filed: Jul. 12, 2007

(86) PCT No.: PCT/GB2007/002600
§ 371 (c)(1),
(2), (4) Date: May 11, 2009

(87) PCT Pub. No.: WO2008/007095
PCT Pub. Date: Jan. 17, 2008

(65) Prior Publication Data
US 2011/0305912 A1    Dec. 15, 2011

(30) Foreign Application Priority Data

Jul. 13, 2006 (GB) .................................... 0613877.0
Apr. 23, 2007 (GB) .................................... 0707801.7

(51) Int. Cl.
*C23C 14/35* (2006.01)

(52) U.S. Cl.
USPC .................. 428/408; 204/192.1; 204/192.12; 204/192.15; 204/192.16; 204/298.02; 204/298.04; 204/298.05; 204/298.09; 204/298.19; 428/698

(58) Field of Classification Search ............... 204/192.1, 204/192.12, 192.15, 192.16, 298.01, 298.02, 204/298.04, 298.05, 298.09, 298.19; 428/408, 428/698
See application file for complete search history.

(56) References Cited

U.S. PATENT DOCUMENTS

| | | | | |
|---|---|---|---|---|
| 4,265,729 A | * | 5/1981 | Morrison, Jr. ........... | 204/192.12 |
| 4,299,678 A | * | 11/1981 | Meckel .................... | 204/192.15 |
| 4,572,776 A | * | 2/1986 | Aichert et al. ........... | 204/298.09 |
| 5,130,005 A | * | 7/1992 | Hurwitt et al. ........... | 204/192.12 |
| 5,628,889 A | * | 5/1997 | Gardell et al. ........... | 204/298.19 |
| 5,688,382 A | * | 11/1997 | Besen et al. ............. | 204/192.12 |
| 6,221,217 B1 | * | 4/2001 | Moslehi et al. .......... | 204/298.19 |
| 6,726,993 B2 | * | 4/2004 | Teer et al. ..................... | 428/408 |
| 6,749,959 B2 | * | 6/2004 | Nakata et al. ................. | 429/517 |
| 6,864,007 B1 | * | 3/2005 | Iqbal et al. .................... | 429/518 |
| 7,052,794 B2 | * | 5/2006 | Nakata et al. ................. | 429/514 |
| 7,087,145 B1 | * | 8/2006 | Choquette et al. ....... | 204/298.19 |
| 7,097,922 B2 | * | 8/2006 | Shen et al. ..................... | 428/698 |
| 7,771,858 B2 | * | 8/2010 | Budinski et al. .............. | 429/457 |
| 7,851,107 B2 | * | 12/2010 | Nakata .......................... | 429/518 |

FOREIGN PATENT DOCUMENTS

| | | | |
|---|---|---|---|
| EP | 1 231 655 | * | 8/2002 |
| JP | 2000-067881 | * | 3/2000 |
| JP | 2004-235091 | * | 8/2004 |
| JP | 2006-286457 | * | 10/2006 |

* cited by examiner

*Primary Examiner* — Archene Turner
(74) *Attorney, Agent, or Firm* — Head, Johnson & Kachigian, P.C.

(57) ABSTRACT

The invention is directed toward a method and apparatus which can be used to allow the sputter deposition of material onto at least one article to form a coating on the same. The new form of magnetron described herein allows an increase in sputter deposition rates to be achieved at higher powers and without causing damage to the coating being created. This can be achieved by improved cooling and use of a relatively high magnetic field in the magnetron while at the same time increasing the power to the magnetron by increasing the current at a rate faster than the voltage.

14 Claims, 10 Drawing Sheets

COATING APPARATUS AND METHOD

CROSS REFERENCES TO RELATED APPLICATIONS

This application is the US National Phase of PCT Application No. GB/2007/002600 filed 12 Jul. 2007 which claims priority to GB Application No. 0613877.0 filed 13 Jul. 2006 and to GB Application No. 0707801.7 filed 23 Apr. 2007, each of which are incorporated herein by reference.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATED-BY-REFERENCE OF MATERIAL SUBMITTED ON A COMPACT DISC

Not Applicable

BACKGROUND OF THE INVENTION

The invention to which this application relates is to apparatus for use in the application of a coating, typically by sputtering of material from one or a series of targets provided as part of respective magnetrons.

The invention also relates to the provision of improved coatings which are corrosion resistant and therefore allow the protection of articles which otherwise would be prone to corrosion in their normal environmental conditions.

The application of material onto articles to form a coating layer or layers using the sputtering of material from targets located with magnetrons is well known. There are several different forms of apparatus which can be used, one of which is referred to as a closed field unbalanced magnetron array with the magnetrons being provided in a spaced array within a coating chamber which is held in a vacuum. The articles to be coated are selectively placed in the coating chamber and may be moved so as to allow the exposure of the articles to the sputtered material from the targets. The selective activation of the targets and/or selective introduction of gases into the coating chamber, allow the particular form of layers and the formation of the layers to be adjusted and hence the coating to be formed in a desired manner.

A known problem with magnetron sputtering apparatus is that the deposition rates can be relatively slow in comparison to other coating forming means. This has therefore tended to mean that while the quality of the coatings which are applied are of a standard so as to make the same attractive for relatively high cost articles, the coating of lower cost articles using the magnetron sputtering method and apparatus may not always be commercially practical. This therefore means that articles may be coated by other deposition methods which have a higher deposition rate but frequently, the coatings are of inferior quality. One such type of article is a plate for a fuel cell, typically for use in automobile or other vehicle power systems. The fuel cell plates are used in liquid which is corrosive and therefore the fuel cell plates need to be protected from corrosion. Conventionally this is achieved by coating the fuel cell plates with an inert metal such as precious metal such as gold or platinum. These materials are expensive. It is also important that the coating which is applied is conductive in this particular use and indeed in many other uses there is a desire to be able to provide a conductive, corrosion resistant coating.

BRIEF SUMMARY OF THE INVENTION

One aim of the invention is to provide apparatus which allows for the sputter deposition of material to form a coating with an increased deposition rate and to do so whilst at least maintaining the quality of the coating which is achieved by conventional sputtering deposition. A second aim is to provide an alternative conducting, corrosion resistant, coating for articles and furthermore to provide a coating which has improved tribological properties.

In a first aspect of the invention there is provided a magnetron for the sputter deposition of material from at least one target of a material mounted in association with the magnetron, said magnetron including a magnet array comprising a series of spaced magnets, means to allow the introduction and passage of a cooling fluid, and a power supply and wherein when increasing the level of the power supply there is at least a phase during which the current increases at a greater rate than the voltage level.

In one embodiment during said phase the voltage level is substantially constant.

Typically the said phase occurs after an initial phase at the commencement of operation of the magnetron during which initial phase both voltage and current levels increase. Typically during the initial phase the current and voltage increase at a similar rate.

In one embodiment the magnetron includes an inlet located at or adjacent to a first extremity of the magnetron and an outlet located at or adjacent to a further extremity, in one example the opposing extremity, of the magnetron to thereby allow liquid which passes through the magnetron to pass across substantially all of the area of the rear face of the target of the magnetron.

Preferably, the inlet and outlet are located such that the liquid passes across all of the rear face of the target thereby providing an improved cooling effect on all of the target and the magnet array.

Preferably, the outlet and inlet lie in line with a magnet or magnets mounted at the periphery of the magnetron and, yet further, to the rear of the said magnet or magnets. This position ensures that the liquid flowing through the passage extends across the entire portion of the rear surface of the target. This therefore prevents the build-up of an air pocket in the passage which is found to conventionally occur especially when the outlet does not lie in line with the magnet but instead lies in part of the passage which lies inwardly of the outer magnet array. The current invention will therefore prevent the common occurrence of air pockets at the top of the magnetron, when the magnetron is used in a vertical orientation.

In one embodiment, the liquid flows through the magnetron with a turbulent flow.

In one embodiment, the magnet array is located to the rear of the target and the channel through which liquid flows between the magnet array and the rear of the target is less than 5 mm in depth and preferably in the region of 2-3 mm.

In one embodiment, the magnets which are used for the magnet array are of a corrosion resistant material, such as samarium cobalt magnets.

Typically, because the magnets are made of a corrosion resistant material, the same can be exposed to the cooling liquid and hence the front faces of the magnets are spaced in contact or close to contact with the rear face of the target.

In one embodiment, the gap between the front face of the magnets and the rear face of the target is in the region of 1-2 mm.

In one embodiment the power supplied to the magnetrons can be increased to a greater level than would be possible in a conventional magnetron and still allow the generation of acceptable and, in some instances, improved coating quality. Conventionally, if the power supply to a magnetron is raised above a certain level, the quality of the coating can deteriorate rapidly. It is found that using a magnetron or indeed a number of magnetrons in accordance with the invention, allows the power to be increased with the voltage only rising by a relatively small amount thereby allowing the quality of the coating to be maintained and in some instances improved while at the same time allowing the application of the coating to be increased in terms of speed of deposition and hence increased speed of throughput of articles.

In one embodiment, the magnetrons are mounted in apparatus in the form of an in-line coating system and typically, opposing pairs of deposition magnetrons are located along a longitudinal axis with each of the magnetrons in the pair sputtering material towards each other with the articles to be coated passing therebetween so as to allow the material to be applied to both sides of the article simultaneously.

In one embodiment the facing magnetrons are of opposite polarity to form a closed field arrangement.

In one embodiment, the coating which is applied using the magnetrons in accordance with the invention is a conductive, corrosion resistant coating. In one embodiment the coating is a carbon coating in which the carbon carbon bonds are mostly of the sp2 form.

In a further aspect of the invention there is provided a magnetron, said magnetron having a material target forming at least part of the front surface of the same, a supporting frame and to the rear and/or side of the target, a series of magnets formed as a magnet array, said magnet array including a series of magnets provided around the periphery of the target, and at least one magnet located substantially centrally of the target and wherein, intermediate said first and second magnets, there is provided at least one item of non-magnetic material, said material lying to the rear of the target and provided to form at least part of a channel along which a cooling liquid passes.

In one embodiment the non-magnetic material is of plastic or aluminium.

In one embodiment, the said items of non-magnetic material which are used, embed or enclose items of magnetic material which are located to influence the sputter deposition of material from the targets of the magnetrons.

In order to improve the deposition rate of material from the target of the magnetron the power applied to the magnetrons is increased and the cooling effect which is required to prevent the magnetron overheating as a result of this increase in power is achieved by the improved cooling of the magnetron significantly. The redesign of the cooling channel to ensure turbulent flow, which is more efficient than the conventional laminar flow, and the positioning of the liquid inlet and outlet at the extreme respective ends of the magnetron so that there are no "dead" regions allow the cooling effect to be improved.

With the improved cooling the power which can be applied to the magnetrons can be increased greatly with respect to that which was conventionally possible and indeed it has been found that the only barrier to increasing the power is the practicalities of obtaining a sufficient large power supply.

This is in contrast to conventional magnetrons which have the characteristic that if both the current and voltage increase at about the same rate then problems occur in that if the voltage on a target of graphite carbon material in a magnetron goes over a critical value (say −550V) then there is arcing at the surface of the graphite and solid particles of carbon are produced which can deposit on the articles, hence producing defects and the particles can subsequently fall out of the coating leaving pores which is unsatisfactory for a corrosion resistant coating.

The increase in power which can be achieved and which is useful can be determined with respect to the particular coating material which is to be applied from the target of the magnetron. For example, if the coating which is to be applied is a graphitic coating the limitation to the power which is used on the magnetron of the invention may be caused at the moment by the breakdown of the bond between the carbon target and the copper backing plate in the magnetron. If the bond is improved to resist this then the power used can be increased further. However with other target materials, the restriction may not apply, and the power may be increased yet further, for example by 6 times the conventional power supply. This may then cause other practical problems to be encountered such as overheating of sealing means used with the magnetron.

In accordance with a further aspect of the invention there is provided a magnetron with a magnet array and wherein the arrangement of the magnets is configured to increase the power applied to the magnetron such that the current increases while the voltage remains almost constant.

In this manner it is found that as the voltage increase is minimised so the problems of arcing and poor quality coatings is avoided while at the same time allowing for the increase in power and hence deposition rate increase.

Typically the magnetron can receive and operate with increased power of at least 3 times the conventional power level.

The improved cooling which is achieved allows the application of higher power to the magnetron. The use of strong SmCo magnets close to the rear surface of the target produces very large magnetic field strength across the front surface of the target. These large magnetic fields influence the voltage-current characteristics of the magnetron such that when the power applied is increased large current increases are obtained along with relatively small voltage increases which is a very desirable characteristic for the application for coatings such as the conductive, corrosion resistant coating herein described. Conventionally with this type of coating a voltage higher than about 550V causes arcing and particles of carbon to be deposited as previously stated, so the improvement in the coatings at higher deposition rates which is achieved in accordance with this invention is very significant. The characteristics will also allow the deposition of a wide range of materials at high rates without the limit of voltage level, which is imposed by many power supplies intended for magnetron sputtering, being reached.

In a further aspect of the invention there is provided a magnetron having a target of material in association therewith and from which material is required to be deposited and wherein the magnetron, with a target length of 380 mm and width of 175 mm, when provided with a target of Cu, can be operated at power up to 30 kW without damage to the magnetron to provide a coating on a substrate with no droplet type defects detected using SEM examination of the coating.

In one embodiment the cooling fluid provided in the magnetron is water and the temperature of the same is 35 degrees Celsius.

In one embodiment when the power is 28 kW, and the substrates to be coated are held on a rotating carrier at 4 rpm at a distance of 150 mm from the target the deposition rate from the target 30 microns per hour.

It has been found that the current-voltage characteristics indicate that much higher power could be used. The deposition rate of the magnetron rival that of arc sources but without the associated droplet formation.

In one embodiment a magnetron with an industrial size 665 cm$^2$ sputter target and with high power density (up to 40 W/cm$^2$) was used.

Typically a relatively strong magnetic field is created at and adjacent to the sputter face of the target of the magnetron and the magnetron is capable of sputter regimes at high power but low voltage.

In one embodiment the magnetron is operated with aluminium, titanium or graphite material targets and mounted with in a deposition chamber in which the pressure can be adjusted to suit specific requirements.

In one embodiment a large increase in the current which can be applied to the magnetron is achieved with little or no increase in voltage, indicating efficiency of electron confinement near the target and possibly self-sputtering at higher power densities.

Typically the substrates to which the coating is applied are biased.

In a further aspect of the present invention there is provided apparatus for the application of material to form a coating on at least one article, said article held on a carrier within a chamber in which there is provided at least one magnetron in accordance with the invention as herein described.

In one embodiment the carrier is rotatable in said chamber.

In a further aspect of the invention there is provided a method of operating a magnetron to sputter deposit material from a target of said material provided with said magnetron, said method comprising the steps of introducing a cooling fluid into the magnetron body, passing said fluid to cool at least the target and a magnet array held within the magnetron body, such that said fluid passes substantially across all of the rear of the target, providing a power supply to the magnetron to commence the sputter deposition of material, and wherein the power supply level is increased for at least one phase of operation in which the current is increased at a rate greater than that of the voltage level.

In one embodiment the voltage level is held substantially constant during said phase.

In one embodiment the magnetrons are operated in accordance with a closed field unbalanced magnetron sputter ion plating method to deposit material onto said at least one article.

In one embodiment two magnetrons in accordance with the invention were used to sputter carbon targets, to study sputtering characteristics, stability of plasma, and deposition rates. The targets were then co-sputtered with a chromium target to produce the coatings in greatly reduced deposition times.

In a further aspect of the invention there is provided an article having a coating applied to at least one surface thereof, said coating including material sputter deposited from at least one magnetron in accordance with the invention.

In a further aspect of the invention, there is provided an article which is to be used in a corrosive medium, said article having a coating applied to at least part of the surface thereof, said coating being conductive and corrosion resistant and wherein the coating material is substantially carbon based with a graphite microcrystalline structure.

In one embodiment the coating is of a type in which the carbon carbon bonding is mostly of the graphite sp2 form.

In one embodiment the coating has a specific wear rate under wet conditions of less than $10^{-16}$ m$^3$/Nm.

In one embodiment the wear rate of the coating is $2.8 \times 10^{-17}$ Nm

In one embodiment the coating is applied using a method as described in the applicant's patent GB2331998.

In one embodiment, a layer of chromium or any other transition metal is applied firstly to the article followed by the carbon material.

In one embodiment the coating formed is a mixture of carbon and chromium or any other transition metal.

In one embodiment, the article to be coated is a plate used in a fuel cell.

In one embodiment the fuel cell is to be used in a vehicle.

Typically the coating which is formed is inert and conducting and can therefore be used instead of precious metals such as gold and platinum in providing a conducting, corrosion resistant coating for applications such as fuel cell plates.

In a further aspect of the invention there is provided a coating containing Chromium doped carbon.

In one embodiment the coating is applied using a closed field unbalanced magnetron sputter ion plating method which is found to show exceptional wear resistance combined with high load bearing capability. In one embodiment the coating is used in the production of thin, high quality carbon films for an application such as fuel cells.

Preferably the coating is applied using one or more magnetrons of the type described in the first aspect of the invention. Typically the method achieves the faster deposition rates required.

In one embodiment the coatings were produced at the faster deposition rates and specific wear rates of less than $5 \times 10^{-17}$ m$^3$/Nm obtained from pin on disc testing at 80N load (1 to 2 GPa).

In one embodiment the coating is a hydrogen-free amorphous carbon-chromium coating, electrically conducting and containing mainly sp$^2$ bonding.

The apparatus and method in accordance with the invention is therefore able to produce coatings at very high rates economically and this makes it possible to provide apparatus for applying coatings to articles which are relatively large volume products, such as fuel cell plates.

It should therefore be appreciated that each of the above aspects of the invention, independently, can provide an improved coating for specific articles and/or improved. operation of the magnetrons used to sputter deposit the material. It should also be appreciated that each of the aspects, in combination with one or more of the other aspects can provide further advantages and indeed it is possible to incorporate all of the aspects into the magnetron.

BRIEF DESCRIPTION OF THE DRAWINGS

Specific embodiments of the invention are now provided with reference to the accompanying drawings, wherein:—

DETAILED DESCRIPTION OF THE INVENTION

Figure 1:
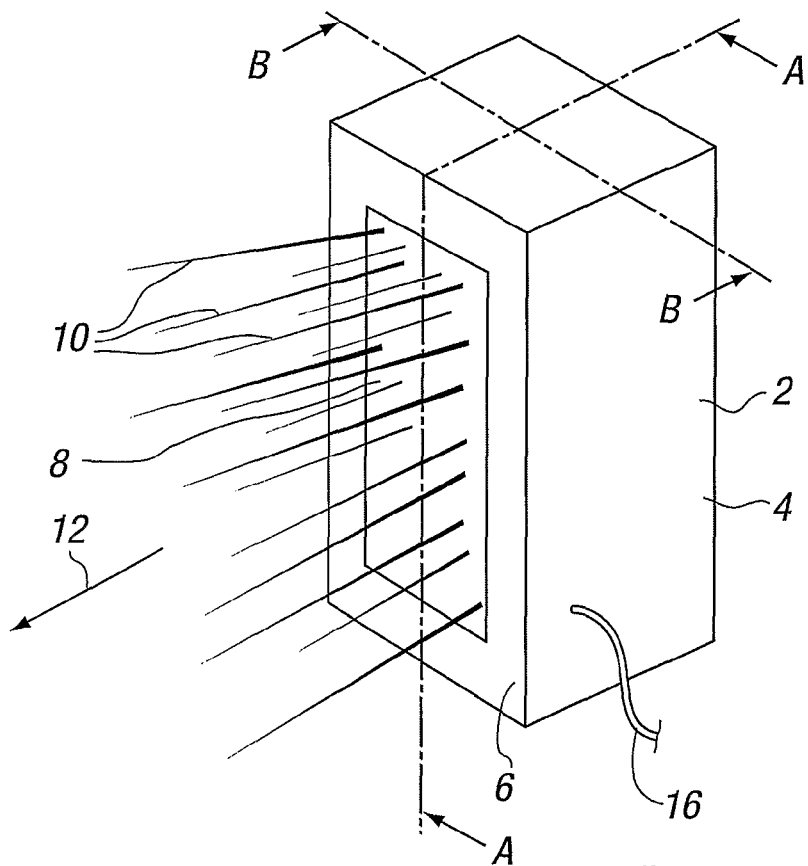
FIG. 1 illustrates a perspective view of a magnetron in accordance with one embodiment of the invention.

Referring firstly to FIG. 1, there is provided a magnetron 2 having an outer body and supporting frame 4 with a front surface 6 which is formed at least partially by a front surface of the target 8 of material from which particles 10 are sputtered in direction 12 to deposit onto a surface of an article (not shown).

To the rear and side of the target there is provided an array of magnets which will be described subsequently. The magnetron can be fitted and sealed within a coating chamber with the first face 6 facing into the chamber.

Figure 2:
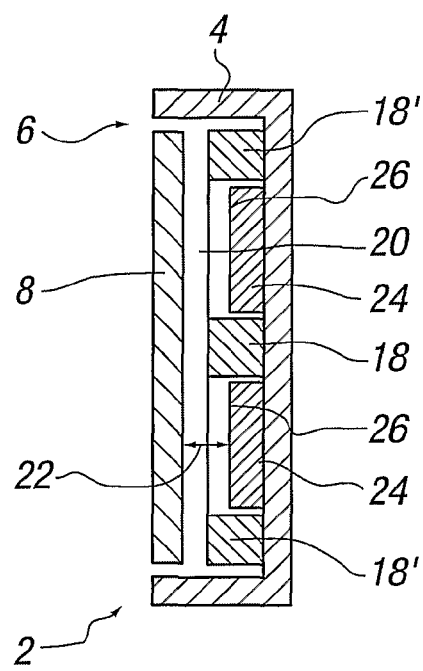
FIG. 2 illustrates a cross sectional elevation of the magnetron of FIG. 1 along lines A-A, in accordance with a first embodiment of the invention.

Referring to FIG. 2, there is illustrated the magnetron 2 in cross section along line A-A in accordance with one embodiment of the invention. The target of material 8 forms at least a portion of the front surface 6 of the magnetron. The target in this case is formed of carbon from which particles can be deposited. The target is provided in the supporting frame 4 which can be formed of metal and it may also include insulating material so as to separate the metal components from the cooling liquid and electricity supply 16 which passes to the magnetron to cause the operation of the same to sputter material.

To the rear of the magnetron, there is provided a series of magnets 18, said magnets provided in an array or configuration so as to suit specific operating characteristics. The magnets are located, typically in an outer ring 18' adjacent the periphery of the target and at least one magnet 18 is provided to the centre of the target as shown. In operation, the magnets and/or target can heat up rapidly and the generation of heat can cause poor performance of the magnetron and/or a need to reduce the power supply.

In an effort to reduce the heat which is generated, the power supply is conventionally limited to a lower level hence reducing the deposition rate of the sputtered material. A cooling liquid is also introduced into the magnetron to pass through a channel 20 to provide a cooling effect on the target, frame and magnet.

Referring to the FIG. 2 embodiment, the channel depth 22 is limited by the addition of filling material 24, said filling material typically non-magnetic and located a spaced distance from the rear face of the target so that the inner surface 26 forms a wall of the passage and defines the depth 22 between the filling material 24 and the target 8 as shown. As the channel is restricted in depth, so the amount of liquid which is required to be introduced, is reduced and the flow of liquid becomes turbulent which improves the cooling effect achieved.

Figure 3:
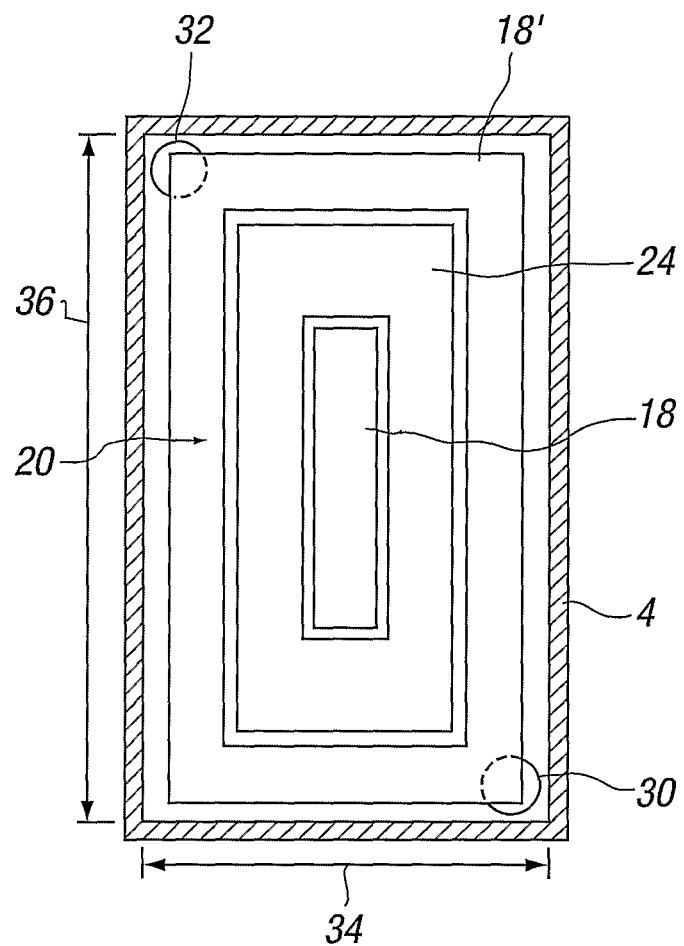
FIG. 3 illustrates a cross sectional elevation of the magnetron of FIG. 1 along line B-B with a cooling liquid inlet and outlet located in accordance with an embodiment of the invention.

FIG. 3 illustrates the magnetron of FIG. 1 in section along line B-B. In this case the inlet 30 and outlet 32 for the cooling liquid into and from the passage 20, are specifically located so as to lie at the opposing extremities of the magnetron. It is found that the positioning of the inlet and outlet 32 at the periphery of the magnetron, ensures that no air pockets are left in the channel 20 and that the liquid can flow across all of the area defined by the arrows 34, 36, thereby further improving the cooling effect which is achieved. Typically, channels (not shown) are provided which link the inlets and outlets to the main cooling area with these channels typically provided behind the magnets.

As a result of the improved cooling which is provided, the power to the magnetron, and hence the deposition rate, can be increased.

Figure 4:
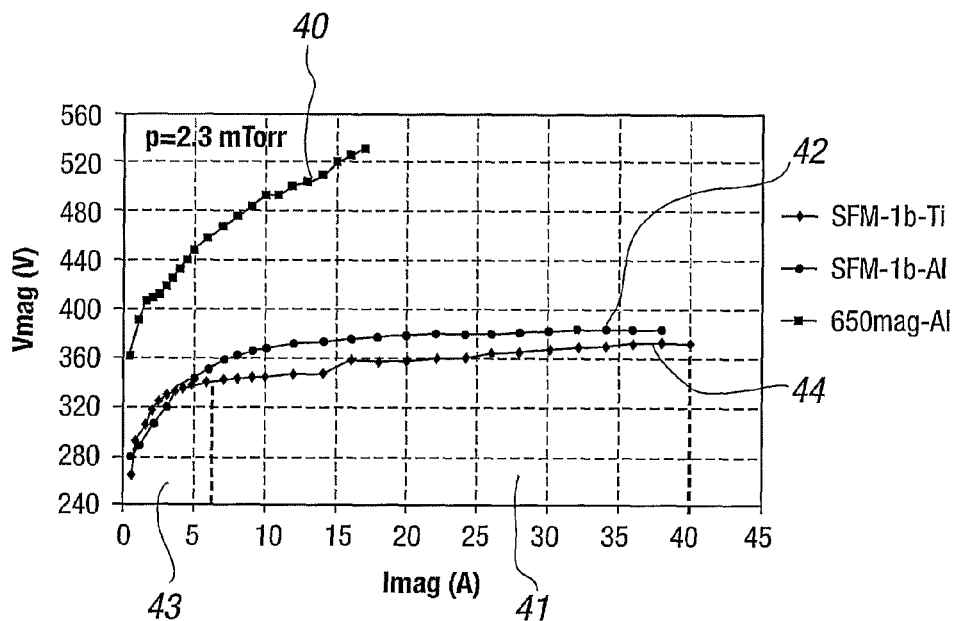
FIG. 4 illustrates a graph showing the Voltage-Current characteristics as the power applied to the magnetron is increased in accordance with the invention.

Referring to FIG. 4, there is shown a graph which illustrates the manner in which power can be applied to the magnetron in accordance with the invention. In this case, it is shown in line 40 for a conventional magnetron that as the current increases so the voltage increases which causes damaged coatings to be created. However the graph lines 42, 44 which represent the use of magnetrons in accordance with the invention show how in the initial phase of operation 43 from start the current and voltage increase at a similar rate and thereafter, in the phase 41, the current increases without the matching increase in the voltage, so it is the current which is increased in particular thereby allowing the application of relatively high power levels to the magnetron, with relatively low voltage values. The ability to kept the voltage levels relatively low avoids damage to the coatings while the increase in current and hence the power level allows increased coating speeds to be achieved. This allows increased power to be achieved in relation to the magnetron, hence increasing the deposition rate but without causing a reduction in the quality of coating which is achieved.

The increase in the deposition rates which is possible has been found to be more than 3 times that of the conventional apparatus and thereby allows the throughput of the coated articles to be increased and thereby rendering the overall process economical commercially, especially for the coating of relatively high volume articles where previously electron beam coating techniques would have been used.

Figure 5:
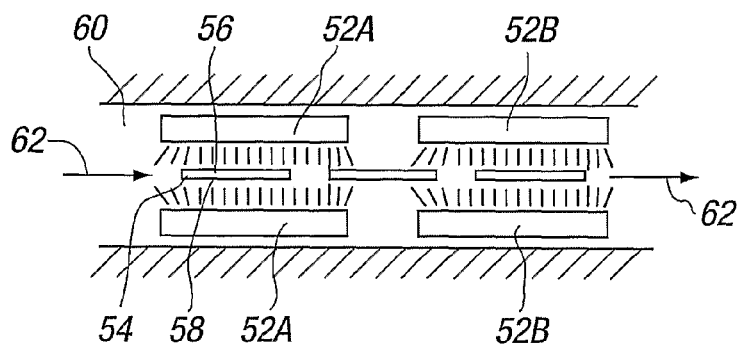
FIGS. 5 and 6 illustrate two types of coating apparatus in accordance with the invention.
Figure 6:
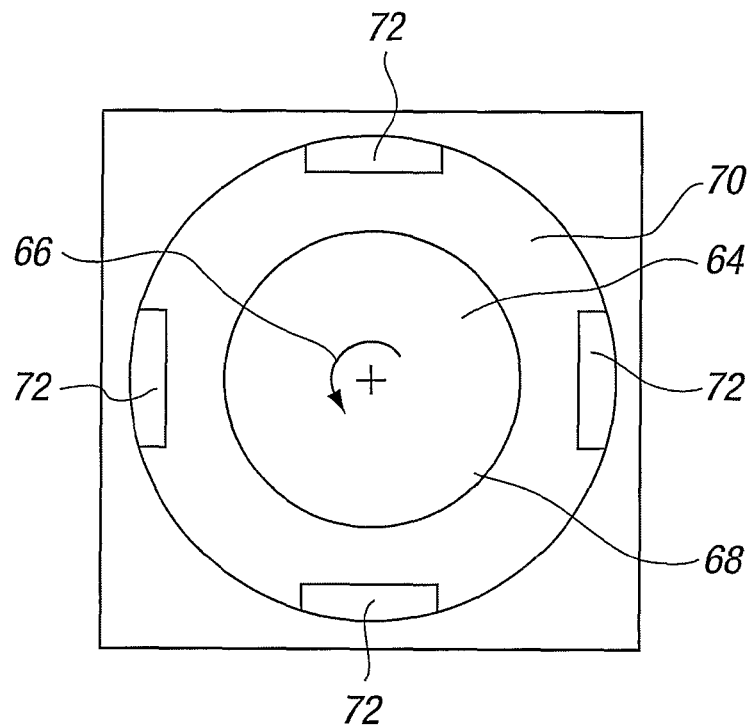

Two examples of coating apparatus which can be used in accordance with the invention are shown in FIGS. 5 and 6 respectively. In FIG. 5, there is illustrated an in-line coating apparatus in which a series of magnetrons 52 are provided in pairs such that, each target in pair 52A is of the same material and each target in pair 52B is of the same material. Thus the material which is deposited from the targets in any given pair, allow the application of a similar coating to opposing faces 56 of the substrate 54 as they are passed through the coating chamber 60 in the direction of arrows 62. The in-line coating apparatus allows the relatively high rate deposition of material onto the faces of the substrates.

FIG. 6 illustrates an alternative coating arrangement in plan. In this case the coating chamber 70 is provided with a series of magnetrons 72 spaced around the same. Substrate carrier 64 is provided to rotate as indicated by arrow 66 so as to allow substrates (not shown) mounted on the external surface 68 of the carrier 64, to be rotated past each of the magnetrons 72 which can be selectively operated to sputter material from the targets mounted thereon at any given time. In one embodiment, the magnetrons may be provided as part of a closed field unbalanced magnetron sputter ion plating apparatus.

Figure 7:
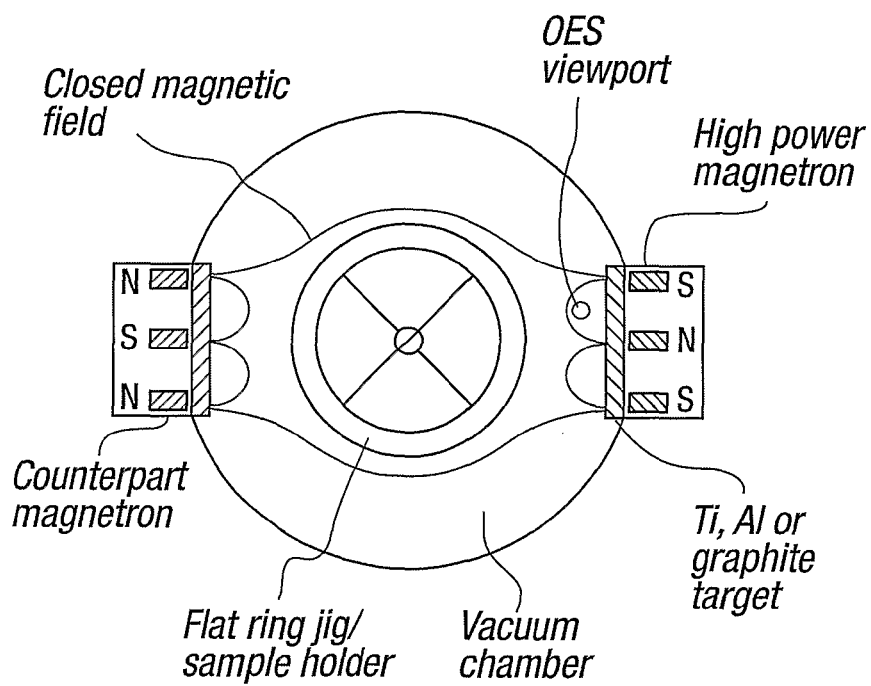
FIG. 7 shows a schematic view of an experimental deposition chamber.

A schematic representation of an experimental apparatus for the magnetron testing is shown on FIG. 7. The vacuum chamber has a diameter of 650 mm and height 600 mm. Prior to experiments it was pumped by a Leybold T-1600 turbopump typically to $6.7 \cdot 10^{-6}$ Pa base pressure. Gas pressure in the chamber was set by regulating gas flow by MKS mass-flow controllers. In these experiments argon flow was regulated between 7.5 and 75 sccm. When the magnetron was operated with a Ti target nitrogen flow was set at approximately 0.6 that of the argon flow to verify operation of the magnetron (HPM) during the reactive process.

Two unbalanced high power magnetrons (HPM) in accordance with the invention were used with standard industrial size rectangular targets 380 mm by 175 mm were mounted opposite each other in the chamber. They formed a closed field magnetic configuration. The magnetrons differ from the conventional magnetron (CM) by a stronger magnetic field above the target and optimised water cooling system. They were powered by Advanced Energy MDX-II DC generators, capable of producing up to 15 kW output power. When current-voltage characteristics were recorded, one HPM was operated at a time with the generator run in current regulation mode.

The optical emission spectra (OES) were recorded through a viewport at the top lid of the chamber using EP200 Verity Instruments monochromator. The line of sight of the viewport, covered by the fused quartz window, was passing at 20 mm from the magnetron target above the longer side of its sputter track.

During deposition of the TiN coating, nitrogen supply in the chamber was regulated by a piezo valve, driven by a controller linked with optical emission monitor, which was set at 497 nm emission line of titanium. Coating properties were studied using a Fischerscope H100 hardness tester and TCL ST-3001 Tribo tester in the mode of unidirectional scratch.

Figure 8:
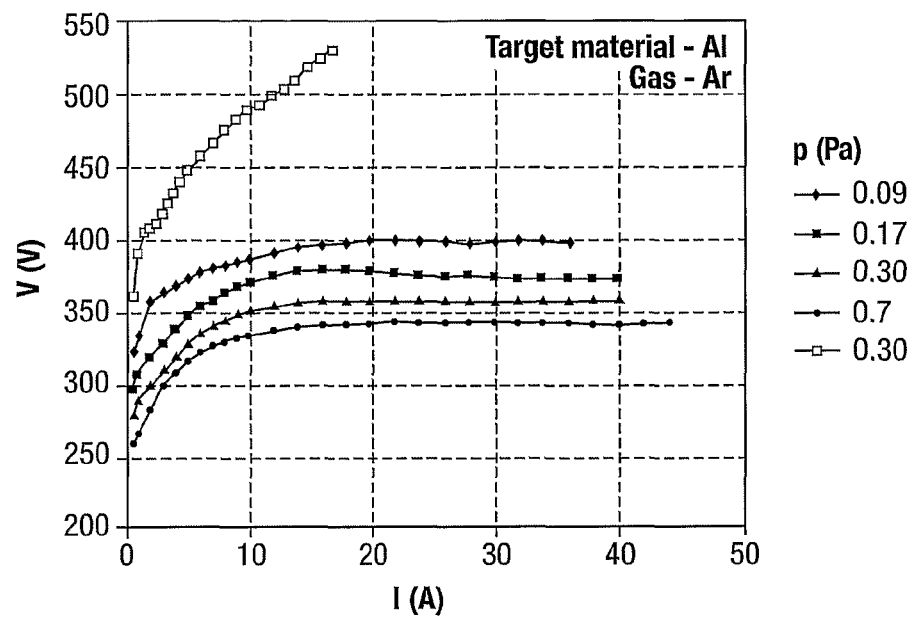
FIG. 8 shows current voltage characteristics of the magnetrons in accordance with the invention (black symbols) and conventional (empty squares) magnetrons with an Al target.

The current-voltage characteristics of the high-power magnetron with aluminium target are presented in FIG. 8. Pressure change from 0.09 to 0.7 Pa did not affect significantly the shape of the curves. With the increase of the discharge current the cathode voltage saturates starting from 16 A, staying practically flat up to the maximum output power of the DC generator. At 0.17 Pa the cathode voltage had a weak maximum 278 V with its value dropping by 5 V above 30 A current on the target. On the contrary the cathode voltage of the standard magnetron did not saturate with current increase, significantly exceeding the cathode voltage of the HPM run at the same pressure of 0.3 Pa.

Figure 9:
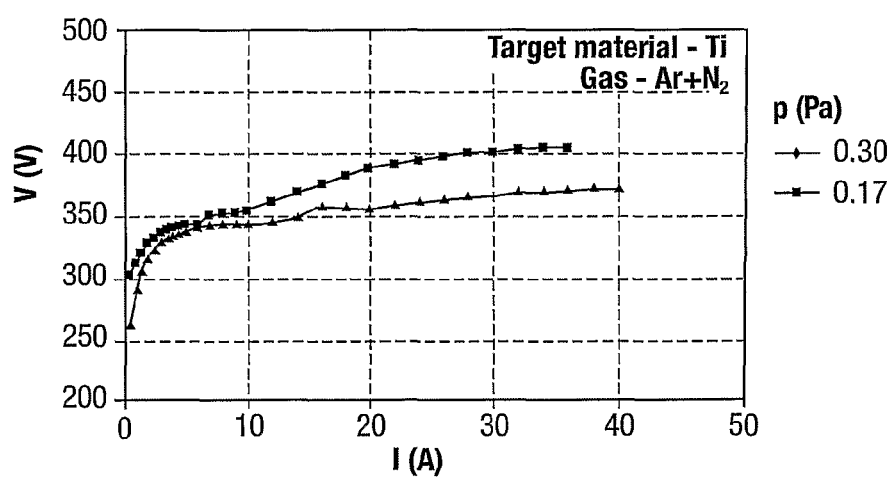
FIG. 9 shows the current-voltage characteristics of the magnetron in accordance with the invention with a titanium target in a mixture of argon and nitrogen.

The current-voltage characteristics of an HPM with a titanium target are presented in FIG. 9. Saturation of the cathode voltage occurred at around 4 to 6 A, then the voltage rises slightly as the current is increased. Small humps can also be seen in both plots. This complex nature of the curves is linked with the formation of a nitride layer on the target surface, which is sputtered away at the higher values of current. Examination after opening the deposition chamber revealed a surface of the erosion track having a silvery metallic colour surrounded by a characteristic yellow deposit on the unsputtered parts of the target.

Figure 10:
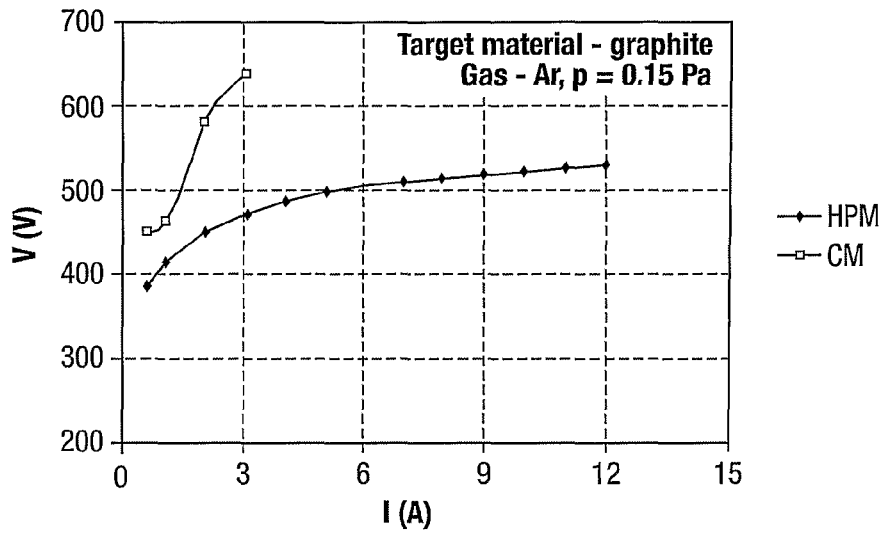
FIG. 10 shows the current-voltage characteristics of the high power and the conventional magnetrons with graphite target.

Current-voltage characteristics of the HPM and Conventional magnetron (CM) with graphite targets are presented on FIG. 10. They demonstrate the same tendency as during the runs with the aluminium target. The HPM curve displays a much slower rise of voltage with current increase in comparison with the conventional magnetron (CM) and allows operation of graphite target at higher power levels without arcing occurring.

Figure 11:
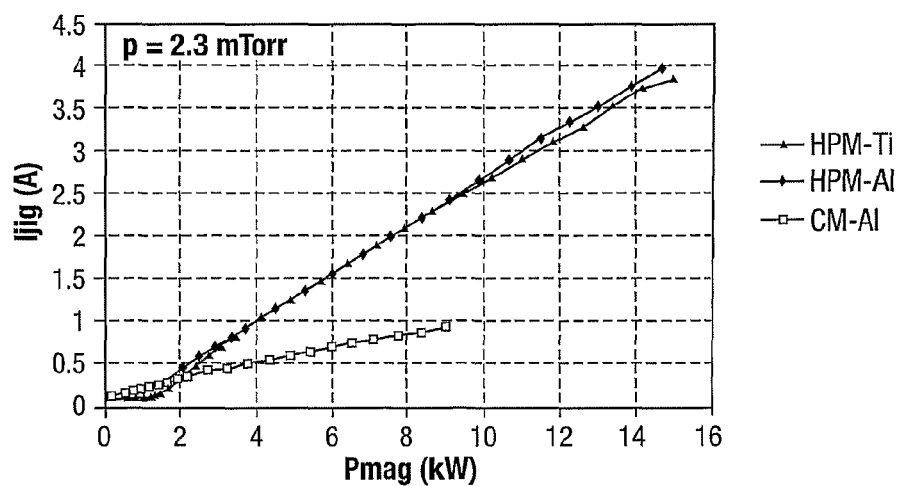
FIG. 11 shows the current to the substrates to be coated which are biased by 60 V DC as a function of power of the magnetron with Ti and Al targets and the CM with Al target.

Operation of the HPM at powers up to 15 kW draws significantly higher current to the samples as shown in FIG. 11. Current to the samples from HPM plasmas increases starting from 1.5 kW on the target, while in the case of conventional magnetron it increases straightaway. It may be attributed to a better confinement of plasma above the HPM target at low discharge power due to its stronger magnetic field. Further, almost linear growth of the current occurs for both magnetrons with the current from HPM plasma 2.5 times exceeding the one from the conventional magnetron.

Figure 12:
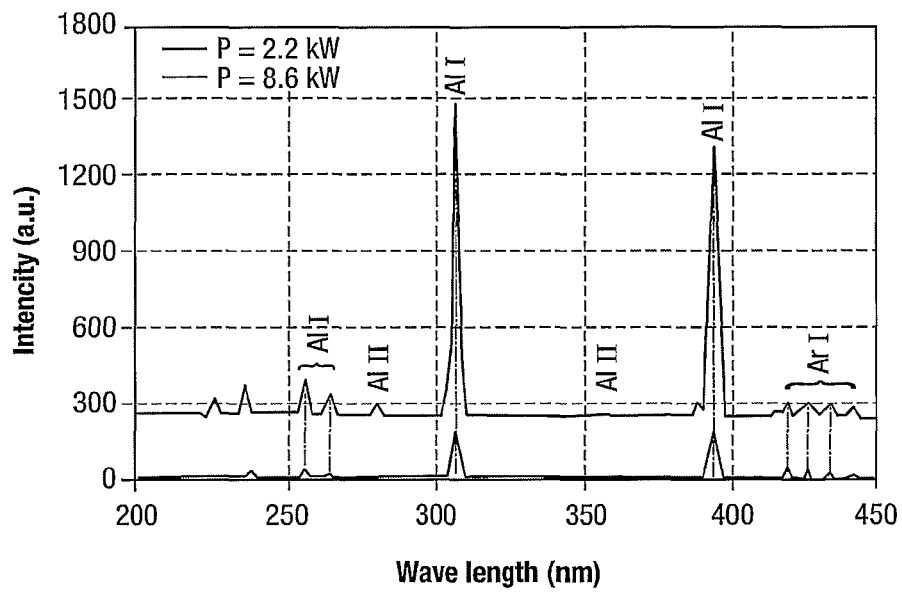
FIG. 12 shows characteristic OES spectra from the magnetron with Al target at 0.17 Pa in argon, at discharge power 2.2 kW and 8.6 kW.

OES spectrum were recorded during operation of the HPM with an aluminium target at 2.2 kW power characteristic to deposition processes with conventional magnetron, and 8.6 kW and are shown in FIG. 12. At the low power the most prominent peaks are with their maximum at 308 and 395 nm, which are associated with emission lines of AlI atoms 308.2, 309.3, 394.4 and 396.2 nm. At the high power they continue to dominate the spectrum with growth of the AlI lines at 257.5 and 266 nm. Also ArI lines at 415.9, 425.9, 430 and 433.4 nm become quite noticeable. Appearance of the emission lines at 281.5 and 358.7 nm, corresponding to the transitions of AlII ions, indicates partial ionisation of the sputtered material. But their small value in comparison with the lines of neutral aluminium points out that conventional sputtering by argon ions dominates the process. Substantial input of self-sputtering mode could be expected at power density around 300 W/cm$^2$ on the target.

Trial deposition run of TiN coating was conducted using two unbalanced HPMs (FIG. 7) powered by 12 kW each. M42 tool steel samples were mounted on the ring sample holder (FIG. 7), which rotated at 4 rev/min. Separation from the magnetron targets, when samples were passing in front of it, was 15 cm.

Resulting coating had hardness 33 GPa and good adhesion properties. No delamination of the coating was observed in the scratch track up to 60 N maximum load. No droplets could be detected by SEM on the coating surface. Total thickness, measured by ball crater method, was 3.36 μm, which gave deposition rate 4 μm/h. For comparison, in a conventional magnetron system at 6 kW net power TiN coating is deposited at 1-1.2 μm/h. These results demonstrate that deposition rates could be increased in comparison with conventional magnetron processes proportionally to the power applied to the sputter target. Also, rates of coating from HPM approach those obtained from arc evaporation technique.

The magnetrons in accordance with the invention in another example are operated at power up to 15 kW with power density on the target up to 40 W/cm$^2$, which is more than 3.5 times that of the conventional magnetron. The current-voltage characteristics indicate that much higher power could be used. The deposition rate of the magnetron rival that of arc sources but without the associated droplet formation.

In a further set of trials relating to coatings formed using the magnetron (HPM), the following was performed. Coatings were deposited in a Teer UDP650/4 closed field unbalanced magnetron sputtering system with four magnetrons. For all coatings, the deposition chamber was configured with two carbon targets (opposite one another) and two chromium targets. Each UDP650 target was 345×145 mm, mounted on a 380×175 mm copper backing plate. Initially, the sputtering system was used with conventional magnetrons, to deposit coatings at 3.5 A current input to the carbon targets, (i.e. at maximum power input possible for stable operation: 2.4 kW, 36 kWm$^{-2}$). DC power was used on the targets and substrates were biased with a pulsed DC supply. A typical coating sequence was used, i.e. ion cleaning, deposition of a Cr adhesion layer, then deposition of a Cr/C graded layer to change composition from pure chromium to the composition of the tribological coating (carbon containing ~7 at % Cr). Parameters are then kept constant until the end of the process. Test pieces coated were M42 high speed steel, ground to a 1200 SiC finish and cleaned ultrasonically in acetone before coating.

For the high deposition rate coatings, two HPMs were used to replace the conventional magnetrons supporting the carbon targets. The HPM design included redesigned water cooling cavities to promote more efficient target cooling, and a stronger magnetic arrangement than that used previously. The magnetrons used for the chromium targets were not changed. Prior to loading any samples, the HPM magnetrons were operated at different powers, and the current—voltage characteristics recorded. It was found possible to sputter the carbon targets, without instability, at currents up to 12 A (560 to 590V) and target powers up to ~7 kW (104 kWm$^{-2}$) compared to the 2.4 kW (36 kWm$^{-2}$) achieved previously.

Substrates were loaded into the chamber, and coated with pure carbon, using high target currents (9 A to 12 A) to establish carbon deposition rates. Required increases in chromium target power were then estimated based on the carbon deposition rates achieved. Coating trials were then carried out at the higher carbon and chromium target current values, using the deposition procedure described above, although deposition times for the final layer were reduced to achieve a coating of the required thickness. Tribological tests (detailed below) were used to assess coating performance. Further coatings were then produced at different carbon target current values from 2.5 A (1.1 kW) to 12 A (7 kW), to assess the suitability of the HPMs for use over a range of target powers. The ion current at the sample fixture was monitored during all coating process runs.

Optical microscopy was used to examine the surface of the coatings, and to study wear tracks following tribological testing. Coating thicknesses were assessed using the ball crater taper-section technique. A standard hardness tester (Wilson/Rockwell B503-R) using a load of 150 kgf was used to assess the adhesion of the coatings. The plastic microhardness was determined using a Fischerscope H100 ultramicro-hardness tester with a Vickers indenter, from the load penetration curves. Data from five indents made on each sample were averaged. The loading/unloading rate was 10 mNs$^{-1}$, with a maximum applied load of 50 mN.

A Teer POD-2 pin-on-disc tester was used to assess the tribological performance of the coatings against a 5 mm diameter WC/6% Co ball under 80N applied normal load. Tests were performed at 200 mms$^{-1}$ linear speed on an 8 mm diameter wear track, for a sliding distance of 360 m. All tests were unlubricated and at room temperature (~25° C.) and relative humidity (~35%). The friction coefficient was monitored using a strain-gauge load cell, and the wear volume measured by producing a ball crater taper-section on the wear track. The wear volume was then normalised with respect to the load and sliding speed to give specific wear rates.

Coating structures were analysed by X-ray Diffraction using a Philips PW 1070/30 instrument and θ/2θ (Bragg-Brentano) configuration. Cu Kα radiation source, 40 kV and 35 mA on the target, was used for the measurement. Scan conditions were: 2θ range of 20-100°; step scan: 0.02°/step, 0.4 sec./step; a Graphite monochromater was used; slit combination 1°-0.5°-0.5-1. The approximate chemical compositions of samples were obtained using Glow Discharge Spectroscopy (GDS) in a LECO GDS-750 QDP apparatus.

Figure 13:
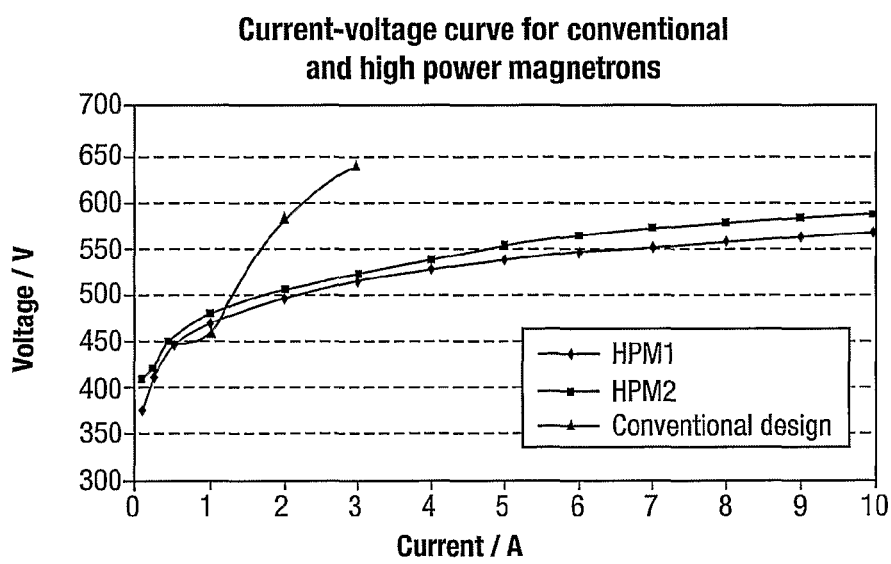
FIG. 13 shows current-voltage characteristics of magnetrons in accordance with the invention.

FIG. 13 shows the current-voltage curves obtained for each of the high power magnetrons tested, compared with the curve for a conventional magnetron. For the new design of magnetron, large increases in target current are obtained with only small increases in target voltage, allowing it to be operated at much higher target powers without introducing instabilities such as arcing. Ion current values recorded on the test piece sample fixture during deposition of the high power coatings were significantly higher (×2.5 to ×3.5) than for the 3.5 A coating as would be expected. This is due to the high flux of ions and electrons from the unbalanced magnetron, which increases as the power input is increased. The sample fixture was the same for all three tests hence it can be assumed that the ion current density has increased significantly. Although, temperatures at the substrate fixture were not monitored during these trials, it can be assumed that these higher ion current densities would have resulted in higher substrate temperatures, and this would need to be considered when assessing the suitability of the high power process to coat temperature sensitive materials. Operation of the HPM at lower powers resulted in similar ion current values to those normally seen for the conventional magnetron at those powers.

Table I shows the coating thickness measurements and relative deposition rates for the standard coating, and two of coatings produced at much higher power with the new magnetron design.

TABLE I

Comparative coating deposition rates.

| | | Coating thickness | | | | |
| --- | --- | --- | --- | --- | --- | --- |
| Magnetron Design | Carbon target current/ A | Cr inter-layer/ μm | GraphitiC/ μm | Total/ μm | Deposition Time GraphitiC/ hrs | Deposition rate GraphitiC/ μm/hr |
| Conventional | 3.5 | 0.2 | 1.8-2.0 | 2.0-2.2 | 4 | 0.45-0.5 |
| HPM | 9.0 | 0.2 | 1.8-1.9 | 2.0-2.1 | 2 | 0.9-0.95 |
| HPM | 12.0 | 0.2 | 2.4/2.5 | 2.6/2.7 | 2 | 1.2/1.35 |

It can be seen that the deposition rate has been increased by up to 2.7 times depending on the operating conditions chosen. This enables the deposition time to be more than halved. These times are for the particular size of target used in the UDP650 system which is a relatively small production system or large R&D system. Deposition rates in larger production systems, often with six larger targets, are twice that of the smaller systems, and should the same designs be applied to the magnetrons in these, deposition rates could again be increased.

Figure 14A:
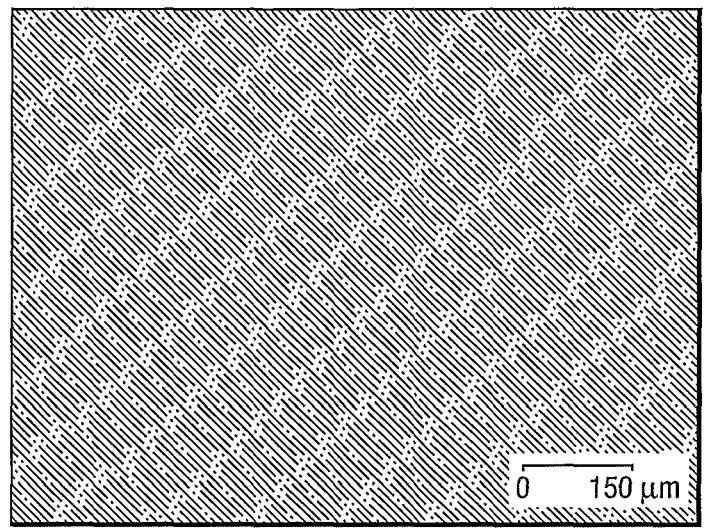
FIG. 14 shows the surface quality of coatings showing very few spots/defects (a) 9 A coating from the magnetron (b) 12 A coating from the magnetron.
Figure 14B:
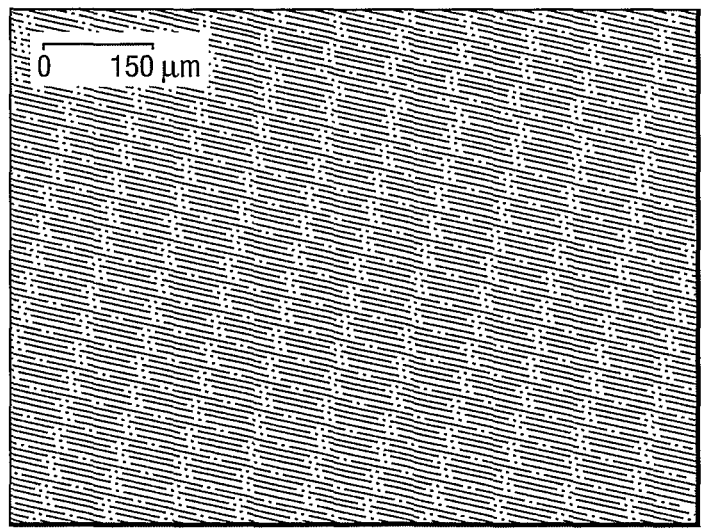

All coatings produced demonstrated good adhesion to the M42 substrate: Rockwell indentations produced in the coatings were classed as HF1 to HF2. FIGS. 14a-b shows the surface quality of the HPM coatings. The 9 A coatings (FIG. 14a) showed very little evidence of spots or defects and generally appeared better than typically seen for 3.5 A coatings produced with conventional magnetrons. The surface quality of the 12 A coating (FIG. 14b) appeared comparable to that usually seen for a 3.5 A coating. i.e. a very low level of surface defects were visible. The plastic hardness values were 1519 to 1729 kgmm$^{-2}$ for the 9 A coatings, and 1554 kgmm$^{-2}$ for the 12 A coating. This compares to 1769 kgmm$^{-2}$ obtained for the 3.5 A coating with Hardness values typically ranging from 1500 kgmm$^{-2}$ to 1700 kgmm$^{-2}$ in this coating system.

Figure 15A:
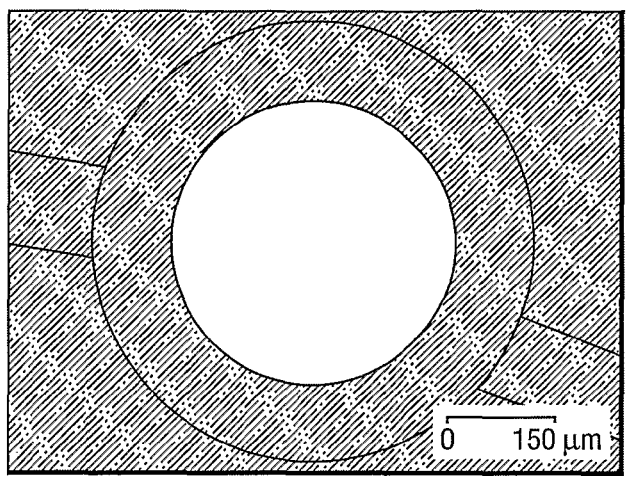
FIG. 15 shows a taper cross-section of wear tracks, following pin-on-disc tests at 80 N (Sliding distance 360 m, 8 mm diameter track, counterface:5 mm diameterWC/5 wt % Co ball)
(a) 3.5 A coating SWR=$2.1 \times 10^{-17}$ $m^3$/Nm (b) 9 A coating SWR=$2.8 \times 10^{-17}$ $m^3$/Nm
(c) 12 A coating SWR=$2.9 \times 10$–17 $m^3$/Nm.
Figure 15B:
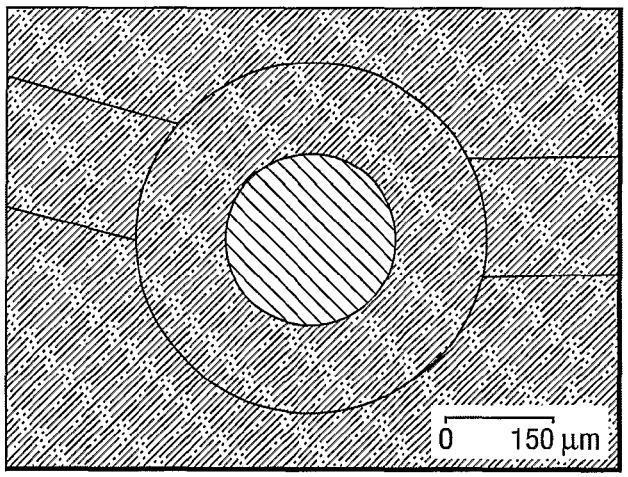
Figure 15C:
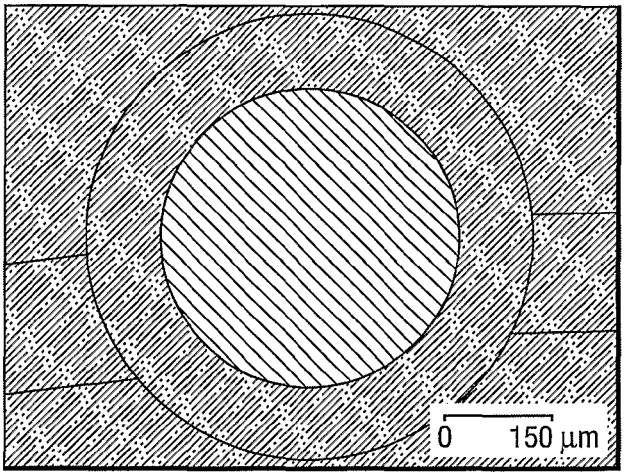
Figure 16:
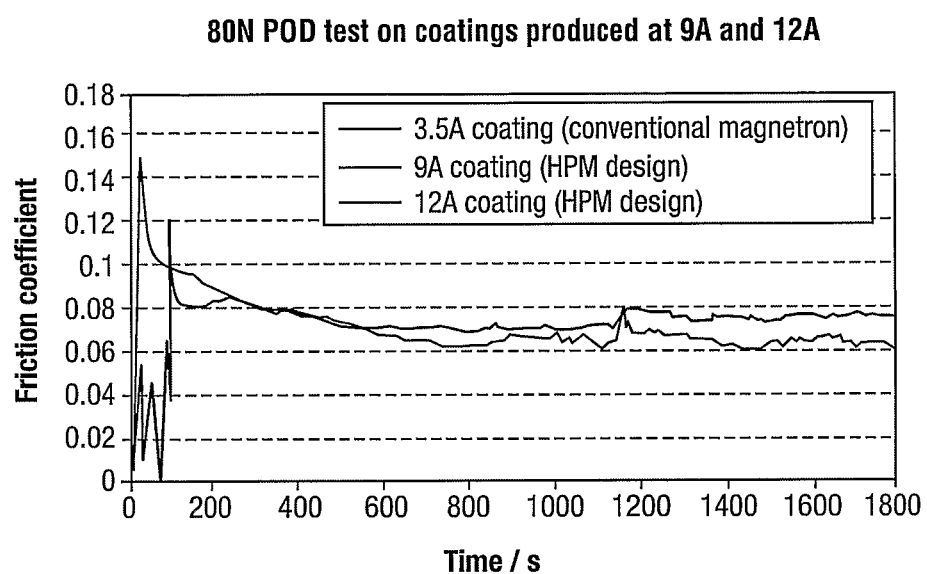
FIG. 16 shows comparison of friction coefficients (80N Pin-on-Disc test against 5 mm diameter WC/6 wt % Co ball)

Pin-on-disc tests as indicated in FIGS. 15a-c, under high (80N) load confirmed that the coatings had similar characteristics to those produced at lower power, as shown in FIG. 16, demonstrating the same high load bearing capability and low friction characteristics. Wear rates measured on taper cross-sections produced by ball cratering on the wear tracks were <3×10$^{-17}$ m$^3$/Nm and friction coefficients were 0.07/0.08 for 9 A coatings and 0.09 for the 12 A coating. This data and the results from the hardness tests, suggest that coatings produced in reduced deposition times should offer the same wear resistance to components operating in air as currently achievable with typical coatings.

Table II shows that the HPMs can also be operated at lower target powers and currents if coatings are required on more temperature sensitive substrates.

TABLE II

Wear properties of coatings produced with the HPM at different currents.

| Magnetron Design | C Target Current*/A | Cr Target Current**/A | Specific Wear Rate at 80N POD/ m$^3$N$^{-1}$m$^{-1}$ | Final Friction Coefficient |
|---|---|---|---|---|
| Conventional | 3.5 | 0.25 | 2.1 × 10$^{-17}$ | 0.07 |
| HPM | 2.5 | 0.18 | 2.7 × 10$^{-17}$ | 0.07 |
| HPM | 5.0 | 0.25 | 3.3 × 10$^{-17}$ | 0.08 |
| HPM | 9.0 | 0.40 | 2.8 × 10$^{-17}$ | 0.08 |
| HPM | 12.0 | 0.54 | 2.9 × 10$^{-17}$ | 0.09 |

*applied to each of two carbon targets
*applied to one of two chromium targets

X-ray diffraction of 9 A and 12 A coatings produced traces identical to that for the 3.5 A coating, showing only peaks characteristic of uncoated M42 high speed steel substrates. No other peaks could be identified suggesting that all three coatings had the same amorphous structure characteristic of the conventional formed coatings.

Analysis by GDS showed the chromium content to fall from approximately 6 at % for the 3.5 A coating to around 3 at % and 1 at % for the 9 A and 12 A coatings respectively, suggesting that the Cr content was lower within the coatings sputtered at faster rates. The chromium target powers chosen were based on the pure carbon deposition rates obtained, and assumption that the chromium sputter rate would increase linearly with power input to the target. However, factors such as cross-contamination of targets and increased ionization within the chamber may have also influenced the chromium sputter rate. The lower chromium content was not found to be detrimental to the toughness and load bearing capability of the coating, but future work should investigate variations to Cr content.

Coatings were produced by sputtering carbon targets from a new magnetron design, with stronger magnetic field and enhanced target cooling. Operation of the high power magnetrons was possible at approximately three times the power input achievable with conventional designs, and this enabled sputter rates to be increased by up to 2.7 times and deposition times to be significantly reduced. Tribological and physical properties of the coatings deposited were not found to be greatly influenced by the fast deposition rates and coatings produced demonstrated good wear rates of <5×10$^{-17}$ m$^3$/Nm when tested in atmospheric conditions against WC/6 wt % Co counterfaces at high (80N) load.

Properties of the coatings such as surface quality and adhesion of the coatings which are achieved using the apparatus and method of the invention are found to be good hence allowing the application of coatings onto articles such as plates for fuel cells to be achieved using sputtering rather than electron beam techniques. The reduction in process times achievable with the use of the magnetrons in accordance with the invention is an important factor in the drive to advance process efficiency, economic aspects and suitability for a wider range of applications.

The provision of coatings of the graphitic type as herein described onto articles which require conductivity and wear resistance but without the need for high priced inert metals to be used also represents a significant development in the manufacture of this type of article.

The invention claimed is:

1. An article, said article comprising:
   a coating applied to at least part of the surface thereof, said coating being conductive and corrosion resistant, the coating comprises a layer including a transition metal applied to a surface of the article and a material applied thereto which is substantially carbon based with a graphite microcrystalline structure;
   said article is electrically conductive and the said coating is applied using apparatus including a chamber in which the article is held with an electrical bias on a carrier, and at least one magnetron with a target of the material which is sputter deposited onto the article such as to allow the article and coating to continue to be electrically conductive when placed in a corrosive medium with the coating acting to protect the article from the corrosive medium and a power supply is provided to the at least one magnetron to cause the sputter deposition of material therefrom and wherein the level of the power supply is increased during the sputter application of the material to form the coating on the article and there is at least a phase during the sputter application in which the current of the power supply is increased at a greater rate than the voltage of the power supply.

2. The article according to claim 1 wherein said coating is produced at specific wear rates of less than <5×10$^{-17}$ m$^3$/Nm from pin on disc testing at 18 newtons load.

3. The article according to claim 1 wherein said coating is a hydrogen free amorphous carbon chromium coating which is electrically conducting and contains mainly sp2 carbon carbon bonds.

4. The article according to claim 1 wherein said coating is of a type in which the carbon carbon bonding is substantially of the graphitic sp2 form.

5. The article according to claim 1 wherein said coating has a specific wear rate under wet conditions of less than 10$^{-16}$ m$^3$/Nm.

6. The article according to claim 1 wherein said coating has a wear rate of 2.8×10$^{-17}$ Nm.

7. The article according to claim 1 wherein said coating formed on the transition metal layer is a mixture of carbon and a transition metal.

8. The article according to claim 1 wherein the article is a plate used in a fuel cell.

9. The article according to claim 8 wherein said fuel cell is to be used in a vehicle.

10. Apparatus for forming a coating on an article as described in claim 1.

11. Apparatus according to claim 10 wherein said magnetron includes a magnet array comprising a series of spaced magnets located to the rear of the target.

12. Apparatus according to claim 11 wherein the magnetron includes an inlet located at or adjacent to a first extremity or edge of the magnetron and an outlet located at or adjacent to a further edge or extremity of the magnetron to allow a cooling liquid to enter the magnetron at the inlet, pass across substantially all of the area of the rear face of the target of the magnetron and across the magnets in the magnet array and leave via the outlet and wherein the outlet and inlet lie to the rear of said magnet array and in line with the magnet or magnets mounted at the periphery of the magnetron.

13. A magnetron according to claim 10 wherein the said phase occurs after an initial phase at the commencement of operation of the magnetron, during which initial phase both voltage and current levels of the power supply increase and then during said phase the voltage level is substantially constant while the current level increases.

14. A method of forming a coating on an article as set forth in claim 1, said method comprising the steps of:
- placing the article into a chamber in which the article is held with an electrical bias on a carrier;
- providing a power supply to operate at least one magnetron with a target of the material to be used to form the coating;
- operating the magnetron to sputter deposit the material onto the article; and
- controlling the level of the power supply to increase the same during the sputter application of the material to form the coating on the article and wherein for at least a phase of providing the power supply the current of the power supply is increased at a greater rate than the voltage of the power supply.

* * * * *